US012614994B2

(12) United States Patent (10) Patent No.: US 12,614,994 B2
Lahbil et al. (45) Date of Patent: Apr. 28, 2026

(54) SYSTEM FOR CONTROLLING A VOLTAGE CONVERTER

(71) Applicant: VALEO EQUIPEMENTS ELECTRIQUES MOTEUR, Creteil Cedex (FR)

(72) Inventors: Hicham Lahbil, Creteil Cedex (FR); Pierre Faverolle, Creteil Cedex (FR)

(73) Assignee: VALEO EQUIPEMENTS ELECTRIQUES MOTEUR, Creteil Cedex (FR)

( * ) Notice: Subject to any disclaimer, the term of this patent is extended or adjusted under 35 U.S.C. 154(b) by 228 days.

(21) Appl. No.: 18/541,412

(22) Filed: Dec. 15, 2023

(65) Prior Publication Data

US 2024/0204701 A1 Jun. 20, 2024

(30) Foreign Application Priority Data

Dec. 16, 2022 (FR) ...................................... 22 13531

(51) Int. Cl.
*H02P 3/22* (2006.01)
*G01R 19/165* (2006.01)
*H02H 7/122* (2006.01)
*H02P 29/024* (2016.01)

(52) U.S. Cl.
CPC .......... *H02P 3/22* (2013.01); *G01R 19/16538* (2013.01); *H02H 7/1227* (2013.01); *H02P 29/0241* (2016.02)

(58) Field of Classification Search
CPC ........ H02P 3/22; H02P 29/0241; H02P 27/06; H02P 11/06; H02P 3/18; H02P 25/03; H02P 29/024; H02H 7/1227; G01R 19/16538; B60L 50/51; B60L 3/003
See application file for complete search history.

(56) References Cited

U.S. PATENT DOCUMENTS

2022/0069758 A1 3/2022 Bertrand et al.

FOREIGN PATENT DOCUMENTS

CN 111211540 A 5/2020
JP 2012050333 A * 3/2012

OTHER PUBLICATIONS

Driving Device for Permanent Magnet Synchronous Motor, Air Conditioner, Driving Device for Fan, Washing Machine, Automobile, and Vehicle (Year: 2012).*
Preliminary French Search Report issued Jun. 14, 2023 in French Application 22 13531 filed on Dec. 16, 2022, 10 pages (with English Translation of Categories of Cited Documents & Written Opinion).

* cited by examiner

*Primary Examiner* — Said Bouziane
(74) *Attorney, Agent, or Firm* — Oblon, McClelland, Maier & Neustadt, L.L.P.

(57) ABSTRACT

A control system for a voltage converter includes a first module for measuring a voltage of the DC voltage source, a module for comparing the measured voltage with a first safety threshold, and a second measurement module for measuring a speed of rotation of the rotary electric machine. A control module generates an open-circuit command which is made up of a command to open the first group of switches and a command to open the second group of switches. If a variation over time of the measured voltage of the DC voltage source is less than a first safety variation. If the speed of rotation measured by the second measurement module is less than a first safety speed.

20 Claims, 2 Drawing Sheets

SYSTEM FOR CONTROLLING A VOLTAGE CONVERTER

TECHNICAL FIELD

The present invention relates to electrical systems comprising a rotary electric machine for a motor vehicle, which machine is controlled by a voltage converter. More specifically, it relates to a system for controlling a voltage converter and to an electrical system comprising a rotary electric machine and such a control system.

PRIOR ART

In the case of electrical equipment such as voltage converters, it is known for a voltage source, for example, a DC voltage source, to be connected to an electric machine, for example, a rotary electric machine, by means of power modules, the role of which is to safely control the nature and the amount of electrical energy transferred from the energy source to the electric machine.

Within a power module, controllable semiconductor switches are known, such as transistor switches such as a metal oxide semiconductor field effect transistor (also designated using the MOSFET acronym) or even a silicon metal oxide semiconductor field effect transistor (also designated using the Si MOSFET acronym) or even a silicon carbide metal oxide semiconductor field effect transistor (also designated using the Sic MOSFET acronym) or even an insulated gate bipolar transistor (also designated using the IGBT acronym) or even a gallium nitride field effect transistor (also designated using the GaN FET acronym).

The switches allow the phases of a stator to be powered, either in a motor mode from a battery electrically powering an on-board network of the vehicle, or in an alternator mode for powering the on-board network and recharging a battery of the vehicle. In the case of an electronic machine comprising three phases in the stator, the voltage converter comprises three low-side switches each connected to one of the three phases and to ground and three high-side switches each connected to one of the three phases and to a positive terminal corresponding to the on-board network of the motor vehicle.

Following a fault in an item of electrical equipment of the motor vehicle connected to the on-board network, an overvoltage can occur on the on-board network, i.e., a voltage can appear on the on-board network that is much higher than the nominal voltage of this network. For example, such an overvoltage can occur in the event of a malfunction of a switch of the voltage converter that remains in the open state or in the closed state while the control system respectively commands it to switch to the closed state or to the open state.

Such an overvoltage can damage or reduce the reliability not only of the rotary electric machine or of the voltage converter and of its control system, but also of any electrical devices connected to the on-board network, for example, a DC-DC converter, a car radio, etc.

In order to limit or stop the overvoltage, it is known for the control system of the electric machine to comprise a voltage detection device and to control the closure and opening of the other switches as a function of the identified fault in order to limit or stop the overvoltage. For example, in the case of a high-side switch that remains in a closed state, the detector will detect a fault indicating that this switch has remained in a closed state and will transmit the information regarding detection of this fault to a control module of the control system that will command the closure of the other two high-side switches and thus make the rotary electric machine safe by setting all the phases of the stator to the same potential, i.e., the phases are short-circuited.

Thus, the control system protects the voltage converter and the rotary electric machine by systematically closing all the switches of the same side when an overvoltage is detected. Such a system consequently does not require the installation of fault detection and identification means on each switch. It is therefore less bulky and less expensive to implement than other control systems.

Nevertheless, such a system exposes the switches, for example, MOSFET transistors, to a high load due to the intensity of the currents that flow through them when short-circuited, which necessarily causes their temperature to rise. These currents and the resulting temperature affect the lifetime of the transistors and therefore of the voltage converter. In addition, the efficiency of the voltage converter is degraded.

Therefore, the aim of the invention is to resolve the disadvantages of the prior art by notably proposing an operation that reduces the load exerted on the switches.

PRESENTATION OF THE INVENTION

According to a first aspect of the invention, it relates to a system for controlling a voltage converter, the voltage converter being configured to connect a rotary electric machine to a DC voltage source, notably to an on-board network, the voltage converter comprising a plurality of switching arms connected in parallel, each arm comprising at least one high-side switch and at least one low-side switch connected to one another at a midpoint configured to be connected to said rotary electric machine, the high-side switches forming a high group and the low-side switches forming a low group, the control system comprising:

a first module for measuring a voltage of the DC voltage source;

a module for comparing the measured voltage with a first safety threshold;

a second measurement module configured to measure a speed of rotation of the rotary electric machine;

a control module generating a first short-circuit command if the comparison module indicates that the measured voltage is greater than a first safety threshold, the first short-circuit command being made up of a command to close a first group of switches selected between the high group and the low group and a command to open a second group of switches comprising the switches of the high group or the low group that do not form the first group.

The control system is noteworthy in that the control module then generates an open-circuit command, the open-circuit command being made up of a command to open the first group of switches and a command to open the second group of switches:

if a variation over time of the measured voltage of the DC voltage source is less than a first safety variation; and if the speed of rotation measured by the second measurement module is less than a first safety speed.

A high-side or low-side switch is understood to mean an electronic power supply switch, for example, of the IGBT (Insulated Gate Bipolar Transistor) type or even of the metal oxide field effect transistor type, also known by the MOSFET acronym.

By virtue of such a combination of features, such an open-circuit switch control module allows the flow of current in the voltage converter to be interrupted when the measured voltage is stabilised, reducing the load duration on the switches of the high group and the low group, thereby avoiding short-circuiting. The production of heat from the switches by the Joule effect is thus reduced throughout the voltage converter.

The first short-circuit command is interrupted in favour of the open-circuit command as soon as the criteria relating to the variation over time of the voltage and to the speed of rotation are verified. As soon as one of the criteria is no longer met, the open-circuit command is interrupted.

Advantageously, the control module generates the open-circuit command if the measured voltage is less than a first limit, notably greater than 110% of the first safety threshold.

Advantageously, the comparison module compares the measured voltage with a second safety threshold greater than the first safety threshold and the control module generates a second short-circuit command when the measured voltage is greater than or equal to the second safety threshold. The second short-circuit command is made up of a command to close the second group of switches and a command to open the first group of switches.

Such a control system allows the voltage converter to be made safe as soon as one of the switches of the voltage converter is short-circuited or open-circuited.

Advantageously, the control module then generates the open-circuit command:

if the measured speed of rotation is less than a second safety speed; and if the variation over time of the measured voltage of the DC voltage source is less than a second safety variation.

Advantageously, the control module generates the open circuit command if the measured voltage is less than a second limit, notably equal to the second safety threshold.

The second short-circuit command is interrupted in favour of the open-circuit command as soon as the criteria relating to the variation over time of the voltage and to the speed of rotation are verified. As soon as one of the criteria is no longer met, the open-circuit command is interrupted.

The second short-circuit command is not interrupted in favour of the first short-circuit command when the measured voltage is less than the second safety threshold.

Advantageously, the open-circuit command follows the first short-circuit command. Advantageously, the open-circuit command follows the second short-circuit command.

Advantageously, when the measured voltage is less than a third limit, notably equal to the first safety threshold, the control module generates normal operation commands, for example, in a motor mode of the rotary electric machine, for example, in a generator mode of the rotary electric machine. The control system is then re-enabled.

Advantageously, the first safety threshold ranges between 110% and 125% of the nominal voltage of the DC voltage source powering the converter, for example, 120% of the nominal voltage of the DC voltage source. For example, the nominal power supply voltage is equal to 48 V, and the first safety threshold ranges between 53 V and 60 V.

Advantageously, the second safety threshold ranges between 120% and 140% of the nominal voltage of the DC voltage source of the voltage converter, for example, 133% of the nominal voltage of the DC voltage source. For example, the nominal power supply voltage is equal to 48 V, and the first safety threshold ranges between 58 V and 67 V.

Advantageously, the first safety speed and/or the second safety speed are the speed at which an electromotive force of the rotary electric machine is less than a given voltage, for example, 48 V. Advantageously, the first safety speed is equal to the second safety speed. In such a configuration, the control module is thus guaranteed to command the opening of the high and low groups only when the speed of rotation of the rotary machine is low, for example, following a decision by a vehicle driver to reduce the speed of the vehicle, or by the presence of a system 10 for disconnecting the electric machine from the control system, causing the speed to drop.

Advantageously, the first safety variation is negative, notably less than −0.2 V/μs. Advantageously, the second safety variation is negative, notably less than −0.2 V/μs. Advantageously, the first safety variation is equal to the second safety variation. A variation greater than this safety variation reflects the possibility that an overvoltage has occurred in the voltage converter, for example, due to a load drop.

Advantageously, the first limit is greater than the first safety threshold. The first limit can range between 110% and 125% of the nominal voltage of the DC voltage source of the voltage converter, for example, 133% of the nominal voltage of the DC voltage source.

Advantageously, the second limit is lower than the second safety threshold. The second limit is greater than the second safety threshold. The second limit can range between 120% and 150% of the nominal voltage of the DC voltage source of the voltage converter, for example, 133% of the nominal voltage of the DC voltage source.

Advantageously, the third limit is lower than the first safety threshold. The third limit can range between 100% and 125% of the nominal voltage of the DC voltage source of the voltage converter, for example, 115% of the nominal voltage of the DC voltage source.

Advantageously, the first group of switches is the low group.

Advantageously, the first group of switches is the group of high-side switches.

Advantageously, the voltage measured by the first measurement module is the voltage between two terminals of the voltage converter configured to be connected to the DC voltage source.

According to another aspect of the invention, the invention relates to an electrical system comprising:

a first and a second power supply terminal configured to be connected to a DC voltage source, notably to a battery of a motor vehicle;

a rotary electric machine comprising a stator having at least three phases;

a voltage converter for powering the rotary electric machine from said DC voltage source, the voltage converter comprising a plurality of switching arms connected in parallel, each arm comprising a high-side switch and a low-side switch connected to one another at a midpoint, each midpoint being connected to at least one phase of said rotary electric machine and a control unit of the high-side and low-side switches, said control unit comprising a control system as described above.

Advantageously, the control unit further comprises:

a controller configured to control the high-side and low-side switches;

a machine control module configured to receive, from an electronic control unit of the vehicle, an instruction to either switch the rotary electric machine to motor mode or to switch the rotary electric machine to alternator mode, and arranged to convert this instruction into a command to control the high-side and low-side switches of the voltage converter;

a logic module for prioritising the commands issued by the control system over the commands issued by the machine control module, the logic module sending the controller the command for the switches received either by the machine control module or by the control system.

Advantageously, the control unit further comprises at least one fault detection module, for example, a phase current direction fault module, and wherein, when the fault module detects a fault, the control unit generates a first short-circuit command or a second short-circuit command or a first short-circuit command and then a second short-circuit command.

According to another aspect of the invention, the invention relates to a mobility craft comprising an electrical system as described above.

According to another aspect of the invention, the invention relates to a method for controlling a system for controlling a voltage converter as described above, the voltage converter being connected to a rotary electric machine and to a DC voltage source, notably to an on-board network, said method comprising:

a first measurement module measuring a voltage of the DC voltage source;

a second measurement module measuring a speed of rotation of the electric machine;

a measurement module comparing the measured voltage with a first safety threshold and comparing a variation over time of the measured voltage with a safety variation;

comparing the measured speed of rotation with a safety speed;

the control module generating a command to open a first group of switches selected from a group of high-side switches and a group of low-side switches if the comparison module indicates that the measured voltage is greater than a first safety threshold and if a variation over time of the measured voltage of the DC voltage source is less than a safety variation and if the speed of rotation measured by the second measurement module is less than a safety speed.

PRESENTATION OF THE FIGURES

The invention will be better understood from reading the following description, which is provided solely by way of an example, and with reference to the attached drawings that are provided by way of non-limiting examples, in which identical references are given to similar objects and in which.

It should be noted that the figures disclose the invention in detail to enable the invention to be implemented; although not limiting, said figures are notably used to better define the invention where appropriate.

6

DETAILED DESCRIPTION OF THE INVENTION

Figure 1:
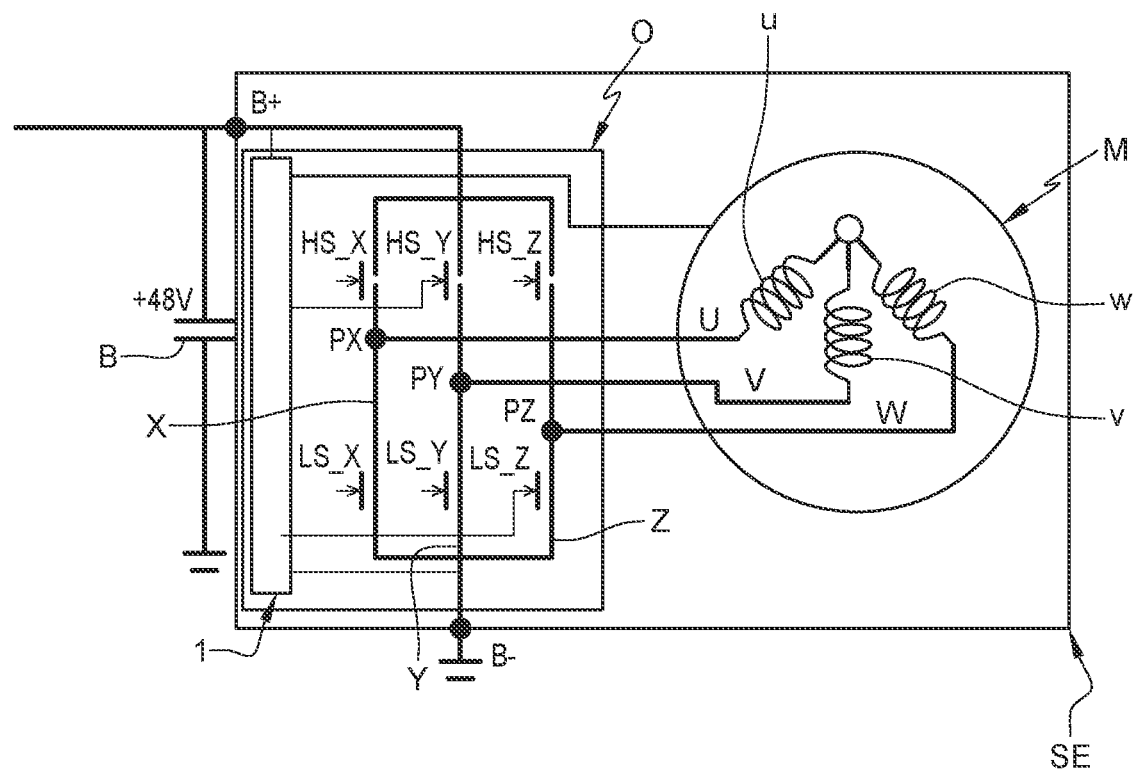
FIG. 1 is a schematic representation of an electrical system comprising a control unit for a voltage converter according to a first aspect of the invention.

FIG. 1 illustrates an electrical system SE comprising a first power supply terminal B+ and a second power supply terminal B− that are connected to a DC power source B, for example, a battery of a motor vehicle allowing other items of electrical equipment (not shown) of the vehicle to be powered by means of an on-board network. The voltage across the terminals B+, B− of the DC voltage source B is, for example, 48 V, which corresponds to a "low voltage" application. In this case, the second terminal B− is the ground of the electrical system SE.

The electrical system SE comprises a rotary electric machine M comprising a stator having at least three phases U, V, W and three coils u, v, w wound on the stator. In this example, the coils u, v, w are connected in a star configuration and each comprise, at their output, the corresponding phase U, V, W, respectively.

The electrical system SE further comprises a voltage converter O for powering the rotary electric machine M from said DC voltage source B. In such a configuration, the phases U, V, W of the electric machine M are powered by the voltage converter with a three-phase alternating current.

The voltage converter O comprises a plurality of switching arms connected in parallel between the terminals B+ and B−. The voltage converter O comprises as many arms as the rotary electric machine M has phases. In this case, in the example described herein, the voltage converter O comprises three arms. Thus, the voltage converter O comprises a first arm X, a second arm Y and a third arm Z.

Each arm X, Y, Z comprises a high-side switch HS_X, HS_Y, HS_Z and a low-side switch LS_X, LS_Y, LS_Z. Each high-side and low-side switch of an arm X, Y, Z is connected to each other at a midpoint PX, PY, PZ. The high-side switches form a switch group, called high group HS. Similarly, the low-side switches form a switch group, called low group LS. The switches of the low group LS and of the high group HS in this case are metal-oxide-semiconductor field-effect transistors (MOSFET).

In the example described herein, each high-side or low-side switch is a metal-oxide field-effect transistor each comprising a flyback diode.

In this case, in this example, there is therefore, on the first arm X, a first high-side switch HS_X connected to a first low-side switch LS_X by a first midpoint PX, on the second arm Y, a second high-side switch HS_Y connected to a second low-side switch LS_Y by a second midpoint PY and a third high-side switch HS_Z, respectively, connected to a third low-side switch LS_Z by a third midpoint PZ.

Each midpoint PX, PY, PZ is connected to at least one phase U, V, W of said rotary electric machine M, so in this case, in this example, the first midpoint PX is connected to the phase U, the second midpoint PY is connected to the phase V and the third midpoint Z is connected to the phase W.

The voltage converter O further comprises a unit 1 for controlling the high-side HS_X, HS_Y, HS_Z and low-side LS_X, LS_Y, LS_Z switches. Said control unit 1 therefore comprises, for each switch, an output connected to the command for the corresponding switch. In order to avoid overloading FIG. 1, only the connection between an output of the control unit 1 and the command for the third low-side switch LS_Z and another output of the control unit 1 and the command for the second high-side switch HS_Y have been shown.

The control unit 1 controls the switches of each arm X, Y, Z via pulse-width modulation (PWM).

Figure 2:
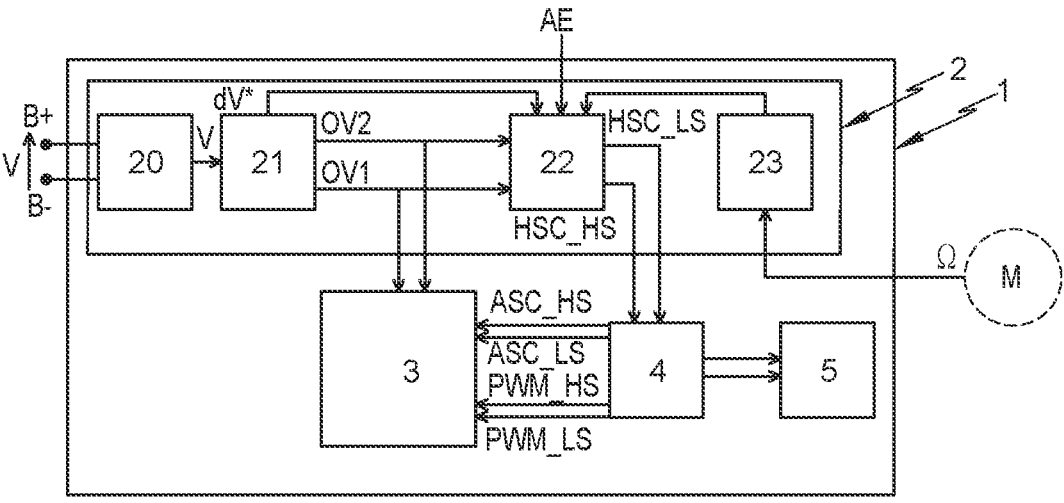
FIG. 2 is a schematic representation of the control unit of FIG. 1 comprising a system for controlling a voltage converter according to another aspect of the invention.

FIG. 2 illustrates the control unit of FIG. 1 comprising a control system 2 for the voltage converter 2 according to another aspect of the invention.

The control unit 1 comprises a control system 2 comprising a first module 20 for measuring a voltage of the DC voltage source B. In the example described herein, the measurement module 20 measures a voltage V across the terminals B+ and B–. In other words, in the example described herein, the first measurement module 20 measures the voltage of the DC voltage source B that in this case has a nominal voltage of 48 V.

The control system 2 comprises a comparison module 21 configured to receive information relating to the voltage V measured by the measurement module 20. The comparison module 21 compares the measured voltage V with a first safety threshold OV1. The first safety threshold OV1 is stored, for example, in a non-volatile memory of the comparison module 21. A third limit to which the voltage V is compared is also stored in the non-volatile memory of the comparison module 21. The value of the third limit in this case is equal to the value of the first safety threshold.

The control system 2 comprises a second measurement module 23 configured to measure a speed of rotation Q of the electric machine M. The second measurement module 23 updates the completed measurement according to a configurable duration, for example, every 100 ms.

The first safety threshold OV1 notably ranges between 110% and 125% of the nominal voltage V of the DC voltage source B powering the converter O, for example, 120% of the nominal voltage V of the DC voltage source. In this case, the first safety threshold OV1 is equal to 56 V.

The comparison module 21 is also configured to compare the measured voltage V with a second safety threshold OV2 higher than the first safety threshold OV1. The second safety threshold OV2 is stored, for example, in a non-volatile memory of the comparison module 21. The comparison module 21 is also configured to compute a variation over time dV* of the voltage V from two successive measurements of the voltage V. A second limit to which the voltage V is compared is also stored in the non-volatile memory of the comparison module 21. The value of the second limit in this case is equal to the value of the second safety threshold.

The second safety threshold OV2 notably ranges between 120% and 140% of the nominal voltage V of the DC voltage source B of the voltage converter O, for example, 133% of the nominal voltage V of the DC voltage source B. In this case, the second safety threshold OV2 is equal to 64 V.

The control system 2 further comprises a control module 22. In the example described herein, the control module 22 is produced based on logic gates. As an alternative embodiment, the control module 22 can be a microcontroller.

The comparison module 21 sends the control module 22 information relating to the first safety threshold OV1, for example, in the form of a high logic level when the measured voltage V is greater than the first safety threshold OV1, and a low logic level otherwise.

The comparison module 21 sends the control module 22 information relating to the second safety threshold OV2, for example, in the form of a high logic level when the measured voltage V is greater than the second safety threshold OV2, and a low logic level otherwise.

Upon receiving the information corresponding to the first safety threshold OV1, the control module 22 issues a first short-circuit command made up of a command to close a first group of switches LS, HS, selected from among the group of high-side switches, i.e., the high group HS, or the group of low-side switches, i.e., the low group LS, and a command to open a second group of switches comprising the switches of the high group or of the low group that do not form the first group. In the example described, the first group of switches is the low group LS and the second group of switches is the high group HS. The first short-circuit command ASC_LS is a command to close all the switches of the low group LS and a command to close all the switches of the low group LS.

The control module 22 also receives information relating to the voltage variation dV* from the comparison module 21 and information relating to the speed Q from the second measurement module 23.

Starting from the state in which all the switches of the low group LS are closed and in which all the switches of the high group HS are open. In the case whereby the voltage variation dV* is less than a first safety variation and the speed of rotation Q is less than a first safety speed, the control module 22 then generates an open-circuit command, made up of a command to open all the switches of the low group LS and all the switches of the high group HS.

Configuring the switches in this way places the voltage converter O in an open circuit state and allows the flow of current in the voltage converter O to be momentarily interrupted when the measured voltage is considered to be stable, which reduces the load duration of the switch, thereby avoiding a short-circuit. The production of heat from the switches by the Joule effect is thus reduced throughout the voltage converter.

The first safety variation is preferably less than –0.2 V/μs. The first safety speed is the speed for which an electromotive force of the electric machine M is less than 48 V.

Upon receiving the information corresponding to the second safety threshold OV2 being exceeded, the control module 22 issues a second short-circuit command ASC_HS. The second short-circuit command in this case is made up of a command to close the second group of switches, in this case the high group HS, and a command to open the first group of switches, in this case the low group LS.

The control module 22 again receives information relating to the voltage variation dV* from the comparison module 21 and information relating to the speed Q from the second measurement module 23.

Starting from the state in which all the switches of the low group LS are open and in which all the switches of the high group HS are closed. In the case whereby the measured voltage V is less than the second safety threshold OV2, and where the voltage variation dV* is less than a second safety variation and where the speed of rotation Q is less than a second safety speed, the control module 22 then generates the open-circuit command.

In the example described, the value of the second variation is equal to the value of the first variation. In this case, –0.2 V/μs. In the example described, the second safety speed is equal to the first safety speed.

Optionally, the control module 12 can also comprise one or more inputs AE arranged to receive error information, for example, error information relating to an excessively low voltage (Under Voltage (UV)) on the on-board network. Upon receiving error information on the one or more inputs AE, the control module 12 can also issue a command to close the first group of switches and optionally a command to open the second group of switches.

In the embodiment described herein, the control unit 1 further comprises a machine control module 3, a logic module 4 and a controller 5, also referred to as a "driver".

The machine control module 3 comprises an input (not shown) for receiving, from an electronic control unit of the vehicle, an instruction either to switch the rotary electric machine M to motor mode according to a supplied torque value, or to switch the rotary electric machine M to alternator mode according to a resistive torque in order to recharge the DC voltage source of the vehicle. The machine control module 3 converts this instruction into a command for the high-side HS and low-side LS switches, with said command being transmitted via the logic module 4 and the controller 5. In other words, by virtue of the machine control module 3, the logic module 4 and the controller 5, the high-side switches HS and the low-side switches LS each receive a command, for example, via pulse-width modulation PWM_HS, PWM_LS, to open or close.

Notably, the logic module 3 is configured to prioritise the commands issued by the control system 2 over commands issued by the machine control module 2. In other words, the control system 2 then has priority over the machine control module 3. When the machine control module 3 is a microprocessor and when the control module 22 and the logic module 4 are produced using logic gates, the reaction time of the machine control module 3 (typically of the order of ten microseconds) is longer than the reaction time of the control module 21 (typically of the order of a microsecond). Thus, the prioritisation implemented by the logic module 4 ensures that the voltage converter O and the rotary electric machine M are made safe faster.

Figure 3:
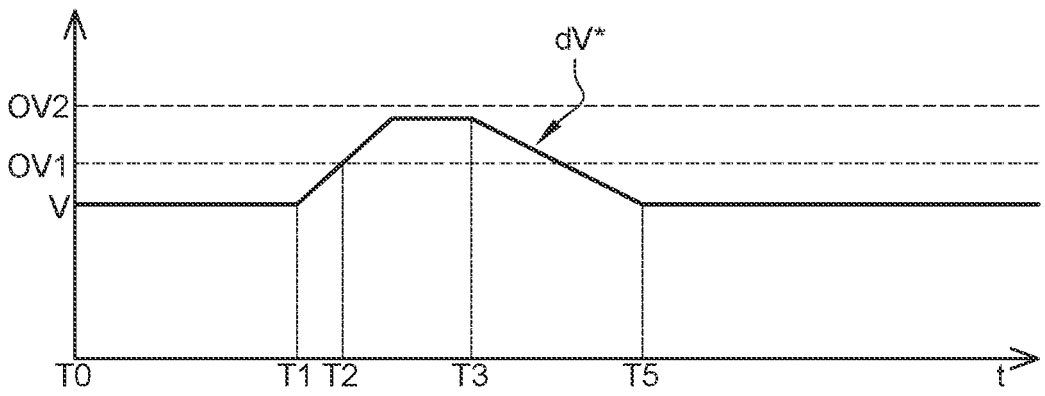
FIG. 3 is a histogram representing the voltage measured across the terminals of a DC voltage source according to a first use case of the control system of FIG. 1.
Figure 4:
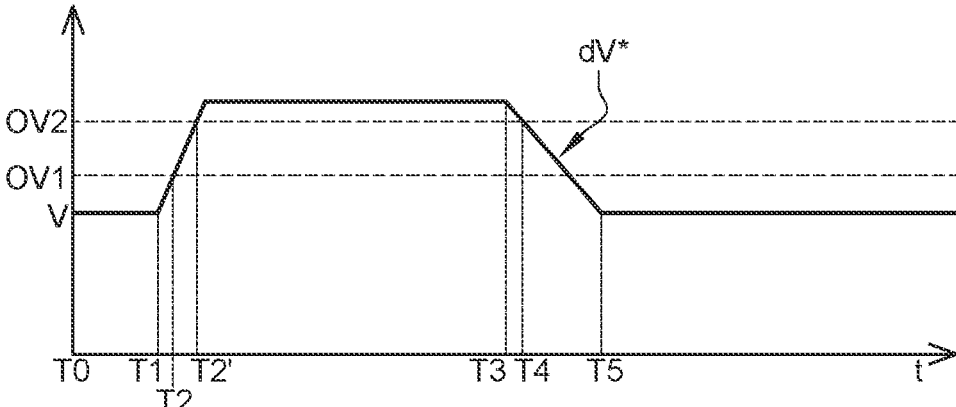
FIG. 4 is a histogram representing the voltage measured across the terminals of a DC voltage source according to another use case of the control system of FIG. 1.

FIGS. 3 and 4 illustrate histograms of the evolution of the voltage V measured across the terminals B+ and B− in two use cases of the voltage converter O and of the control system 2 of the voltage converter O.

In the histogram of FIG. 3, over a first period, in this case between the instants T0 and T2, the voltage converter O controls the high-side and low-side switches normally according to the instruction from the electronic control unit of the vehicle. Over this period, the measured voltage V is lower than the first safety threshold OV1, notably, for a first duration, it is equal to the nominal voltage of the DC voltage source B, in this case 48 volts. At an instant T1, the first DC power source B disconnects from the on-board network while the rotary electric machine is in generator mode. This disconnection generates a load-dump effect that causes an overvoltage on the on-board network. Following this disconnection, at an instant T2, the measured voltage V exceeds the first safety threshold OV1, in this case 56 volts. The comparison module 21 of the control system 2 then sends the control module 21 the information indicating that the measured voltage V is greater than the first safety threshold OV1. Upon receiving this command, the control module 22 generates the first short-circuit command ASC_LS and commands the closure of the switches of the first group and the opening of the switches of the second group. In this case, in this example, the control module 22 sends the logic module 4 a command to close the low-side switches in order to ground the phases and a command to open the high-side switches. The logic module 4 re-sends, irrespective of the commands also sent by the machine control module 3, these commands to the controller 5 in order to command the closure of the switches of the low group LS and the opening of the switches of the high group HS.

The comparison module 21 computes the variation dV* and compares it with the first safety variation. In FIG. 3, the variation dV* corresponds to the slope of the voltage signal V. It appears that the variation dV* is positive until the voltage V stabilises, between the first safety threshold OV1 and the second safety threshold OV2. The variation dV* then becomes negative at the instant T3. The instant T3 is the instant from which the variation dV* is less than the first safety variation. Simultaneously or consecutively, the control module 22 compares the speed of rotation Ω of the rotary electric machine M with the first safety speed. In FIG. 3, after the instant T3, the speed of rotation Q is lower than the first safety speed of the electric machine. At the instant T3, the control module 22 therefore generates an open circuit command and commands the opening of the switches of the first group and the opening of the switches of the second group. In this case, in this example, the control module 22 sends the logic module 4 a command to open the low-side switches and, if necessary, a command to open the high-side switches. The logic module 4 re-sends, irrespective of the commands also sent by the machine control module 3, these commands to the controller 5 in order to command the opening of the switches of the low group LS and of the high group HS. The voltage V across the terminals of the DC voltage source B then drops in order to return to its nominal value, with the circuit then being open.

In the histogram of FIG. 4, unlike the histogram of FIG. 3, the voltage V does not stabilise between the first safety threshold OV1, reached at the instant T2, and the second safety threshold OV2, reached at the instant T2'. In this case, the control module 22 successively generates the first short-circuit command ASC_LS, then the second short-circuit command ASC_HS made up of the command to open the switches of the first group and to close the switches of the second group. In this case, in this example, the control module 22 sends the logic module 4 a command to open the low-side switches and a command to close the high-side switches. The logic module 4 re-sends, irrespective of the commands also sent by the machine control module 3, these commands to the controller 5 in order to command the opening of the switches of the low group LS and the closure of the switches of the high group HS.

The voltage V then stabilises at a value above the second safety threshold OV2. The driver of the vehicle receives a signal inviting them to reduce the speed of the vehicle, which has the effect of reducing the speed of the vehicle and consequently that of the rotary electric machine M. Alternatively, the vehicle comprises a device for disconnecting from the transmission system allowing the speed of the rotary machine M to be reduced. This stabilisation shows that the control system 2 has applied the correct strategy for short-circuiting the switching arms of the voltage converter O with regard to the type of fault that generated the overvoltage.

The control system 2 can thus, if the speed of rotation of the rotary electric machine M is less than the safety speed, generate an open circuit command and command the opening of the high groups and low groups in order to return to the open circuit when the voltage measured across the terminals of the DC voltage source B drops below the second safety threshold OV2. This is illustrated in FIG. 4.

In FIG. 4, the variation dV* is positive until the voltage V stabilises, above the second safety threshold OV2. The variation dV* then becomes negative at the instant T3. The instant T3 is the instant from which the variation dV* is less than the first safety variation. The control module 22 also compares the speed of rotation Q of the rotary electric machine M with the first safety speed. In FIG. 4, after the instant T3, the speed of rotation Q is lower than the first safety speed of the electric machine. At the instant T4, the voltage V drops below the second safety threshold OV2. At the instant T4, the three conditions are met and the control module 22 generates an open circuit command and commands the opening of the switches of the first group and the opening of the switches of the second group.

In FIGS. 3 and 4, the voltage V again drops below the first safety threshold OV1 at the instant T5, the control module 22 again generates commands for normal operation, for example, in a motor mode of the rotary electric machine, for example, in a generator mode of the rotary electric machine. The control system is then re-enabled.

It also should be noted that the invention is not limited to the embodiment described above. Indeed, it will be apparent to a person skilled in the art that various modifications can be made to the embodiment described above, in the light of the teaching just disclosed to them.

Thus, in the embodiment described above, the switches of the first group are the low-side switches and the switches of the second group are the high-side switches but, as an alternative embodiment, the switches of the first group can be the high-side switches and the switches of the second group can be the low-side switches.

Similarly, the rotary machine described above is a three-phase machine. As an alternative embodiment, the rotary electric machine more generally can have n phases, for example, n=6 for a six-phase machine. In this case, the voltage converter O also comprises n switching arms.

Similarly, in the embodiment described above, the coils u, v, w are connected in a star configuration. As an alternative embodiment, the coils u, v, w can be connected in a delta configuration.

Similarly, in the embodiment described above, the logic module 4, the control module 21 and the machine control module 3 are produced as distinct entities. As an alternative embodiment, the logic module 4, the control module 21 and the machine control module 3 can be produced as a single entity, for example, a microcontroller comprising a programmable logic circuit, for example, of the FPGA (Field-Programmable Gate Array") type.

In the detailed presentation of the invention provided above, the terms used should not be interpreted as limiting the invention to the embodiment disclosed in the present description, but should be interpreted to include all the equivalents that can be contemplated by a person skilled in the art by applying their general knowledge to implementing the teaching that has just been disclosed to them.

The invention claimed is:

1. A system for controlling a voltage converter, the voltage converter being configured to connect a rotary electric machine to a DC voltage source, notably to an on-board network, the voltage converter comprising a plurality of switching arms connected in parallel, each arm comprising a high-side switch and at least one low-side switch connected to one another at a midpoint configured to be connected to said rotary electric machine, the high-side switches forming a high group and the low-side switches forming a low group, the control system comprising:

a first module for measuring a voltage of the DC voltage source;

a module for comparing the measured voltage with a first safety threshold;

a second measurement module configured to measure a speed of rotation of the rotary electric machine;

a control module generating a first short-circuit command if the comparison module indicates that the measured voltage is greater than a first safety threshold, the first short-circuit command being made up of a command to close a first group of switches selected between the high group and the low group and a command to open a second group of switches comprising the switches of the high group or of the low group that do not form the first group;

wherein the control module then generates an open-circuit command, the open-circuit command being made up of a command to open the first group of switches and a command to open the second group of switches:

if a variation over time of the measured voltage of the DC voltage source is less than a first safety variation; and if the speed of rotation measured by the second measurement module is less than a first safety speed.

2. The control system according to claim 1, wherein the comparison module compares the measured voltage with a second safety threshold that is greater than the first safety threshold and in that the control module generates a second short-circuit command, the second short-circuit command being made up of a command to close the second group of switches and a command to open the first group of switches, when the measured voltage is greater than or equal to the second safety threshold.

3. The control system according to claim 2, wherein the control module then generates the open-circuit command:

if the measured speed of rotation is less than a second safety speed; and if the variation over time of the measured voltage of the DC voltage source is less than a second safety variation.

4. The control system according to claim 3, wherein the first safety variation is negative, notably less than −0.2 V/μs.

5. The control system according to claim 3, wherein the first group of switches is the low group.

6. The control system according to claim 3, wherein the voltage measured by the first measurement module is the voltage between two terminals of the voltage converter configured to be connected to the DC voltage source.

7. An electrical system comprising:

a first and a second power supply terminal configured to be connected to a DC voltage source, notably to a battery of a motor vehicle;

a rotary electric machine comprising a stator having at least three phases;

a voltage converter for powering the rotary electric machine from said DC voltage source, the voltage converter comprising a plurality of switching arms connected in parallel, each arm comprising a high-side switch and a low-side switch connected to one another at a midpoint, each midpoint being connected to at least one phase of said rotary electric machine and a control unit of the high-side and low-side switches, said control unit comprising a control system according to claim 3.

8. The control system according to claim 2, wherein the first safety variation is negative, notably less than −0.2 V/μs.

9. The control system according to claim 2, wherein the first group of switches is the low group.

10. The control system according to claim 2, wherein the voltage measured by the first measurement module is the voltage between two terminals of the voltage converter configured to be connected to the DC voltage source.

11. An electrical system comprising:

a first and a second power supply terminal configured to be connected to a DC voltage source, notably to a battery of a motor vehicle;

a rotary electric machine comprising a stator having at least three phases;

a voltage converter for powering the rotary electric machine from said DC voltage source, the voltage converter comprising a plurality of switching arms connected in parallel, each arm comprising a high-side switch and a low-side switch connected to one another at a midpoint, each midpoint being connected to at least one phase of said rotary electric machine and a control unit of the high-side and low-side switches, said control unit comprising a control system according to claim 2.

12. The control system according to claim 1, wherein the first safety speed is the speed at which an electromotive force of the rotary electric machine is less than a given voltage, for example, 48 V.

13. The control system according to claim 12, wherein the first safety variation is negative, notably less than −0.2 V/μs.

14. The control system according to claim 1, wherein the first safety variation is negative, notably less than −0.2 V/μs.

15. The control system according to claim 1, wherein the first group of switches is the low group.

16. The control system according to claim 1, wherein the voltage measured by the first measurement module is the voltage between two terminals of the voltage converter configured to be connected to the DC voltage source.

17. An electrical system comprising:
 a first and a second power supply terminal configured to be connected to a DC voltage source, notably to a battery of a motor vehicle;
 a rotary electric machine comprising a stator having at least three phases;
 a voltage converter for powering the rotary electric machine from said DC voltage source, the voltage converter comprising a plurality of switching arms connected in parallel, each arm comprising a high-side switch and a low-side switch connected to one another at a midpoint, each midpoint being connected to at least one phase of said rotary electric machine and a control unit of the high-side and low-side switches, said control unit comprising a control system according to claim 1.

18. The electrical system according to claim 17, wherein the control unit further comprises:
 a controller configured to control the high-side and low-side switches;
 a machine control module configured to receive, from an electronic control unit of the vehicle, an instruction either to switch the rotary electric machine to motor mode, or to switch the rotary electric machine to alternator mode, and arranged to convert this instruction into a command for controlling the high-side and low-side switches of the voltage converter;
 a logic module for prioritising the commands issued by the control system over the commands issued by the machine control module, the logic module sending the controller the command for the switches received either by the machine control module or by the control system.

19. A mobility craft, wherein it comprises an electrical system according to claim 9.

20. A mobility craft, wherein it comprises an electrical system according to claim 8.

\* \* \* \* \*